United States Patent [19]

Levi

[11] Patent Number: 5,471,844
[45] Date of Patent: Dec. 5, 1995

[54] HIGH DISSIPATION PACKAGING FOR CRYOGENIC INTEGRATED CIRCUITS

[75] Inventor: Mark W. Levi, Utica, N.Y.

[73] Assignee: The United States of America as represented by the Secretary of the Air Force, Washington, D.C.

[21] Appl. No.: 343,141

[22] Filed: Nov. 18, 1994

[51] Int. Cl.⁶ ................................................. F25B 19/00
[52] U.S. Cl. ........................... 62/51.1; 62/64; 62/259.2
[58] Field of Search .................... 62/51.1, 64, 259.2; 165/80.4; 361/700; 236/101 E; 198/778; 280/284

[56] References Cited

U.S. PATENT DOCUMENTS

| | | | |
|---|---|---|---|
| 1,837,271 | 12/1931 | King | 236/101 E X |
| 2,643,282 | 6/1953 | Greene | 62/259.2 X |
| 2,677,937 | 5/1954 | Jones | 236/101 E X |
| 2,947,887 | 8/1960 | Gulton | 62/259.2 X |
| 3,200,881 | 8/1965 | Bucks et al. | 165/80.4 X |
| 3,245,248 | 4/1966 | Ritter | 62/48.1 X |
| 3,390,541 | 7/1968 | Johnson et al. | 165/80.4 X |
| 3,628,347 | 12/1971 | Puckett et al. | 62/48.1 X |
| 3,918,221 | 11/1975 | Benjamin | 236/101 E X |
| 4,253,518 | 3/1981 | Minesi | 361/700 X |
| 4,734,820 | 3/1988 | Lauffer et al. | 361/700 |
| 4,758,926 | 7/1988 | Herrell et al. | 361/700 |
| 4,805,420 | 2/1989 | Porter et al. | 62/514 R |
| 4,970,868 | 11/1990 | Grebe et al. | 62/259.2 X |
| 5,040,053 | 8/1991 | Porter et al. | 357/82 |
| 5,349,499 | 9/1994 | Yamada et al. | 361/700 |

FOREIGN PATENT DOCUMENTS

| | | | |
|---|---|---|---|
| 0062095 | 5/1977 | Japan | 62/51.1 |

*Primary Examiner*—Christopher Kilner
*Attorney, Agent, or Firm*—William G. Auton

[57] ABSTRACT

A packaging apparatus used to store semiconductor devices with a coolant without contaminating the semiconductor devices. The apparatus has an enclosure which is evacuated at room temperature and then cooled in an atmosphere of coolant gas until the gas condenses and the enclosure is partially filled with liquid. The enclosure is then heated to allow the liquid to evaporate and a thermally activated mechanism to trap pure cold gas inside the enclosure. The trapped gas increases internal pressure which maintains a tight seal of the trapping mechanism against a gasket.

7 Claims, 1 Drawing Sheet

HIGH DISSIPATION PACKAGING FOR CRYOGENIC INTEGRATED CIRCUITS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to cryogenic integrated circuits, and more specifically the invention pertains to a packaging apparatus that is used to expose semiconductor devices and other objects to a coolant without contaminating the semiconductor devices.

In the past, cryogenic circuitry has been operated in a bath of liquid, for example liquid nitrogen at its boiling point, in order to obtain the advantages of superior removal of generated heat that evaporative cooling can provide. Such operation has always been done either with the semiconductors exposed to the liquid directly or with the semiconductors in hermetically sealed packages. The former has the problem that, when the system is removed from the bath, the semiconductors are exposed to atmosphere and its contaminants unless elaborate precautions are taken. The latter arrangement prevents exposure to the atmosphere but isolates the semiconductors from direct contact with the liquid. That reduces the effectiveness of the cooling.

The task of providing a packaging method is described which permits the exposure of semiconductor devices to a coolant without risking contamination during acquisition, installation or removal, is alleviated to some extent by the system disclosed on the following U.S. Pat. Nos., the disclosures of which are incorporated herein by reference:

U.S. Pat. No. 5,040,053 issued to Porter et al;

U.S. Pat. No. 4,805,420 issued to Porter et al;

U.S. Pat. No. 4,758,926 issued to Herrell et al; and

U.S. Pat. No. 4,734,820 issued to Lauffer et al.

The patents identified above relate to systems for cooling electronic components. In particular, the Porter et al '053 patent describes a cryogenically cooled integrated circuit apparatus which comprises a vessel for holding cryogenic fluid and an integrated circuit package positioned within an opening at one end of the vessel. The circuit package includes a circuit die, a protective body with first and second faces, a metal lid, and a plurality of metal pins. The protective body surrounds an edge portion of the die. The metal lid is attached to the die and to a portion of the first face of the protective body. The package is positioned so that the lid is in direct contact with the fluid and the pins extend away from the vessel.

The Porter et al '420 patent relates to a cryogenic vessel for cooling electronic components. The vessel is divided into two portions with each portion having an outer wall and an interior immersion chamber. A membrane located between the vessel portions and separating the two chambers contains openings for fluid transfer between the two chambers and an exterior point. Sealing members located between the membrane and each of the vessel portions provide a fluid tight seal of the immersion chambers. An electronic component mounting socket is located on a portion of the membrane within the immersion chambers for mounting an electronic component to be cooled. Cryogenic fluid is introduced into the immersion chambers through a supply conduit in the outer wall of one of the vessel portions.

The Herrell et al patent describes a package for enclosing and cooling semiconductor integrated circuit chips. The package includes a generally planar substrate on which the chips are positioned. A heat sink is positioned in contact with the chips and includes microchannels through which a cooling fluid flows to transfer heat generated by the chips.

The Lauffer et al patent is directed to a cryogenic packaging system for removable mounting an integrated circuit package having a plurality of electrical pins. A plurality of mating pins is provided where each pin has a receptacle filled with liquid mercury, and is connected to an electrical pin of the integrated circuit package. Reducing the temperature causes the liquid mercury to solidify and firmly bonds the electrical pins together. The entire assembly is inserted into a Dewar type vessel and covered with a low temperature liquified gas to cool the integrated circuit package. Although these patents relate to systems for cooling electronic components, they do not describe a system where the enclosure containing the components is evacuated at room temperature, cooled in an atmosphere of clean coolant gas, and then heated to evaporate the resulting liquid and trap cold gas inside the enclosure.

SUMMARY OF THE INVENTION

The present invention includes a storage apparatus that can be used to expose semiconductor devices and other objects to a coolant without contaminating the semiconductor devices.

One embodiment of the invention is a storage apparatus that includes: an enclosure in which the object is placed, the enclosure having one or more apertures through which a coolant passes; seals around the apertures that serve as a sealing means such that an internal pressure within the enclosure exceeding the external pressure on the enclosure will increase the security of the seal(s); and a plug and bimetal strip that serves as mechanically-compliant thermally-actuated (MCTA) means which causes the sealing means to seal at a first temperature.

The first temperature is:

1) substantially above the boiling point of the coolant substance and;

2) substantially below the minimum temperature to which the enclosure is to be subjected while remaining sealed in the presence of a specified external pressure and;

3) such that sufficient coolant substance will be trapped within the apparatus to create a second specified pressure within the apparatus of a specified maximum temperature.

When unsealing, the apparatus temperature is:

1) substantially below the minimum temperature to which the enclosure is to be subjected while remaining sealed in the presence of a second specified external pressure and;

2) above the condensation temperature of the coolant substance at the second specified external pressure.

A coolant substance is used for which the temperatures specified exist. This coolant substance can be nitrogen, argon, or carbon tetrachloride and the MCTA can be either a bimetal actuator or a bistable bimetal actuator which is fixed inside the enclosure and which moves a plug into a gasket about the aperture of the enclosure. Note that the critical temperature of a coolant substance is the temperature above which the coolant cannot be liquified, regardless of pressure.

As described above, the apparatus has an enclosure, which is evacuated at room temperature and then cooled in an atmosphere of coolant gas (such as nitrogen) until the gas condenses and the enclosure is partially filled with liquid. The enclosure is then heated to allow the liquid to evaporate and trap pure cold gas inside the enclosure. The trapped gas increases internal pressure which maintains a tight seal of the against a gasket.

An object of the invention is to provide a means for packaging which will permit the safe access of a volatile coolant to the active face of semiconductor device(s) without compromising the reliability of the semiconductor device(s) by permitting access of contaminants.

Another object of the present invention is to provide a packaging apparatus which permits the exposure of semiconductor devices to a coolant without risking contamination during acquisition, installation or removal.

These objects together with other objects, features and advantages of the invention will become more readily apparent from the following detailed description when taken in conjunction with the accompanying drawing wherein like elements are given like reference numerals throughout.

BRIEF DESCRIPTION OF THE DRAWING

The sole FIGURE of the drawing is FIG. 1, which is a side cross-section view of the apparatus of the present invention.

DESCRIPTION OF PREFERRED EMBODIMENT

Figure 1:
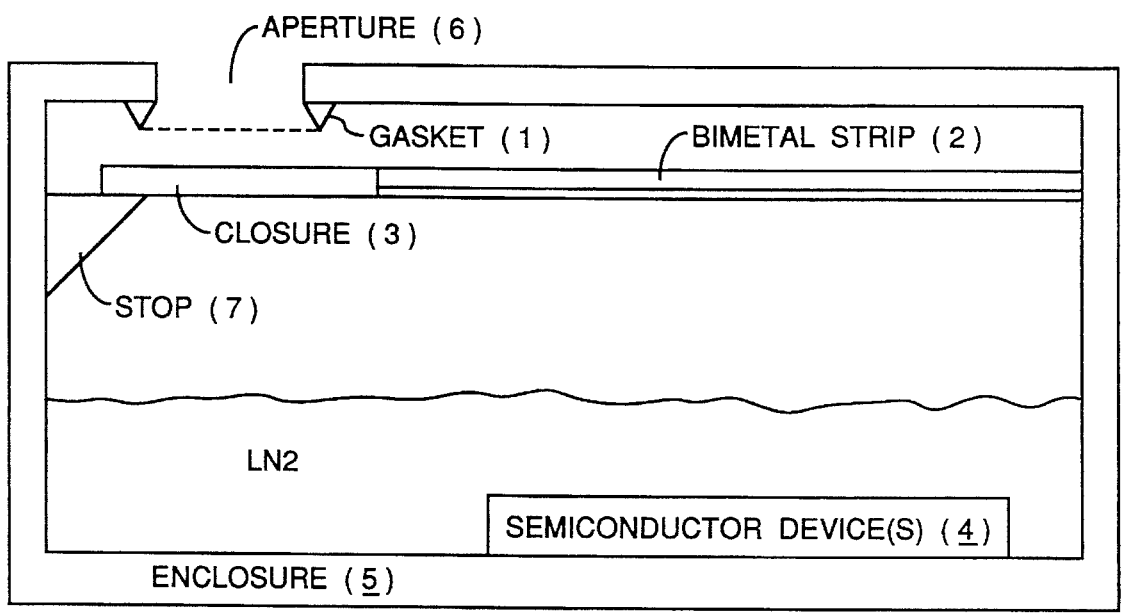

The present invention includes a packaging apparatus to expose objects to a coolant without contaminating them. In order to understand the invention the reader's attention is directed towards FIG. 1, which is a cross sectional view of the packaging apparatus of the present invention.

The system of FIG. 1 includes a gasket 1, a bimetal strip 2, a closure plug 3, a semiconductor device 4, an enclosure housing 5 with an aperture 6 and a plug stop 7. In operation, this invention exposes semiconductor devices to a coolant without contaminating the semiconductor devices. The semiconductor device enclosure 5 is evacuated at room temperature and then cooled in an atmosphere of coolant (such as nitrogen) until the coolant condenses 5 and the enclosure is partially filled with liquid. The enclosure is then heated to allow the liquid to evaporate and trap pure cold gas inside the enclosure. The trapped gas increases internal pressure which maintains a tight seal of the closure plug against a gasket 1.

The packaging method described above permits the exposure of semiconductor devices to a coolant without risking contamination during acquisition, installation or removal.

As mentioned above, the purpose of the invention is to provide a means for packaging which will permit the safe access of a volatile coolant to the active face of semiconductor devices without comprising the reliability of the semiconductor devices by permitting access of contaminants.

In describing this invention six temperatures are defined:

T1, the minimum temperature to which the enclosure will be exposed while not in an uncontaminated atmosphere of the gas which condenses to the volatile coolant;

T2, the boiling point of the volatile coolant to be given access to the active face of the semiconductor device(s);

T3, the temperature of opening of a compliant, thermally-actuated asymmetric valve under conditions of no pressure differential across the valve;

T4, the temperature of closing of that valve under the same restriction;

T5, the critical temperature of the volatile coolant; and

T6, the maximum temperature to which the enclosure will be subjected after its first cooling.

For the proper practice of the invention these temperatures must satisfy T2<T3<T1; T2<T4<T1<T6; T5>T2 and T5 is preferably <T4 and T3≦T4

For an example in which the coolant is liquid nitrogen (LN2) these temperatures might be: T6=125° C., T1=–55° C., T3=T4=–110° C., T5=–126°C. and T2=–195 C. For nitrogen, T5 is fixed, but the remaining temperatures are subject to choice within the restrictions above.

A compliant, thermally-activated asymmetric valve is one for which a pressure differential across the valve tends to maintain a closed condition of the valve or open the valve, depending upon the direction of the differential, and which tolerates extremes of temperature without damage by virtue of a high compliance of the thermal opening/closing mechanical mechanism. As a consequence the opening and closing of the valve are controlled primarily by the temperature of the mechanism when the pressure differential is small, but is controlled by the pressure differential when that is large.

FIG. 1 shows a schematic representation of one possible implementation shown at temperature T2. The long bimetal strip (2), closure (3), aperture (6) and gasket (1) comprise a compliant, thermally-activated asymmetric valve separating the interior of the enclosure (5) from the outside atmosphere. Within the enclosure are a liquid coolant (LN2) and a semiconductor from which heat is dissipated by evaporation of the LN2. Not shown are any electrical connections which may be required for operation of the semiconductor device(s). Since the valve is open there is little difference in pressure between the inside and outside of the enclosure.

The operation of the invention starts at packaging of the semiconductors, when the manufacturer, as the last step other than testing, evacuates the enclosure at room temperature to remove any contamination and then cools it in an atmosphere of clean coolant gas (e.g. nitrogen gas) until it is partially filled with liquid. The enclosure is then brought slowly back to above T1. During the course of warming the liquid will all evaporate by the time T5 is reached and pure cold gas will be trapped inside the enclosure when T4 is reached. After the temperature has increased to T1 the internal pressure will have increased, maintaining a tight seal of the closure against the gasket. In the example above the internal pressure at room temperature would be about 1.7 atmospheres giving a differential of 0.7 atmosphere maintaining closure over and above any closure force provided by the increase of temperature of the thermal actuating mechanism above T4.

Until such time as the temperature is again reduced below T3 by the user the enclosure will remain sealed. Provided that cooling is done in an atmosphere of clean coolant gas (easily by flushing external to the enclosure with the vapor of the liquid being used for operational cooling) the cycle can be repeated by the user without contaminating the interior of the enclosure.

Since optimal cooling of the semiconductor(s) within the enclosure will require a flow of coolant through the interior of the enclosure, more than one aperture and closure could be provided for each enclosure: some for ingress and some for egress of the coolant. These could be actuated by either a common temperature sensing actuation mechanism or individual ones, all having similar thermal actuation characteristics.

The compliance of the valve(s) should be such that the major portion of the force(s) required for maintaining the valve in a tightly sealed condition once T1 is exceeded is provided by the pressure of the gas which has been trapped at T3. Likewise the same could hold at all temperatures between T1 and T6. This is not necessary for functioning of the invention, but is desirable to insure reliability of the thermal actuation mechanism.

The advantages of this invention are the elimination of exposure to potential contamination for semiconductors intended for exposed use in a safe refrigerated environment, during their storage, delivery and installation, as well as during such times as they may be removed from the safe environment.

Alternative forms of this invention are myriad. Other mechanisms could be used in place of the bimetal strip. One example would be a sealed bellows containing a gas. Another could be a bi-metal cricket disk, similar to those commonly used in thermostatic switches, which could provide a snap action and some hysteresis (i.e. T3<T4).

The present invention uses a five step process for cooling a semiconductor device (or any other object).

The first step entails placing the semiconductor device in an enclosure in which ambient gas is evacuated.

The second step of the process entails encompassing the enclosure with a coolant gas so that the coolant gas is allowed to enter an aperture in the enclosure and surround the semiconductor device.

The third step of the process involves cooling said enclosure until the coolant gas condenses and the enclosure becomes partially filled with a liquid formed from condensation of the coolant gas.

The fourth step is accomplished by heating the enclosure to a temperature at a low temperature at which the coolant gas evaporates.

Finally, the process is completed by maintaining the coolant gas around the semiconductor device at a low but higher temperature by allowing pressure developed by evaporation of the coolant gas to press a plug to a gasket and block the aperture of the enclosure.

As shown in FIG. 1, the maintaining step is performed by suspending the plug in proximity with the gasket using a bimetallic strip which is fixed to the enclosure and the plug. The bimetallic strip has an outer side which faces the aperture and an inner side which faces the enclosure's interior. The bimetallic strip has a first metal on its inner side which has a coefficient of expansion greater than that of a second metal, the second metal being on the outer side of the bimetallic strip and wherein the bimetallic strip tends to move the plug towards the gasket when heated, and the bimetallic strip tends to withdraw the plug away from the gasket when cooled. If the bimetallic strip is "bistable" then it has two distinct mechanical positions: open and closed. Many thermostat switches are bistable. In the preferred embodiment, the bimetallic strip causes the plug to close onto the gasket above temperatures at which the nitrogen totally evaporates. Further increase of temperature increases the internal pressure in the enclosure to help seal the plug against the gasket.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A cryogenic storage apparatus in which an object may be stored and cooled, said storage apparatus comprising:
   a. An enclosure in which the object is placed, said enclosure having at least one aperture through which a coolant may be passed wherein said coolant is selected from a group comprising: liquid nitrogen, liquid argon, and carbon tetrachloride;
   b. A sealing means such that an internal pressure within the enclosure exceeding the external pressure will increase the security of the seal(s) and;
   c. Mechanically-compliant thermally-actuated (MCTA) means which cause the sealing means to seal at and above a first temperature;
      1) substantially above the boiling point of the coolant substance and;
      2) substantially below a minimum temperature to which the enclosure is to be subjected while remaining sealed in the presence of a specified external pressure and;
      3) such that sufficient coolant substance will be trapped within the apparatus to create a second specified pressure within the apparatus at a specified maximum temperature;
   d. and wherein said apparatus will unseal;
      1) substantially below a minimum temperature to which the enclosure is to be subjected while remaining sealed in the presence of a specified external pressure and;
      2) above a condensation temperature of the coolant substance at the second specified external pressure.

2. A storage apparatus, as defined in claim 1, wherein the MCTA means is a bimetal actuator.

3. A storage apparatus, as defined in claim 1, wherein the MCTA is a bistable bimetal actuator.

4. A cryogenic storage apparatus in which an object may be stored and cooled, said storage apparatus comprising:
   a coolant selected from a group comprising: liquid nitrogen, liquid argon, and carbon tetrachloride;
   an enclosure in which the object is placed, said enclosure having at least one aperture through which the coolant passes;
   a sealing means such that when an internal pressure within the enclosure exceeds the external pressure on the enclosure the sealing means seals the aperture of the enclosure; and
   mechanically-compliant thermally-actuated means which causes the sealing means to seal at a first temperature, wherein said first temperature is above the coolant's boiling point.

5. A storage apparatus as defined in claim 4, which has a sealing temperature which is approximately at a critical temperature of the coolant, said critical temperature being a temperature above which the coolant cannot be liquified, regardless of pressure.

6. A storage apparatus as defined in claim 4, wherein the sealing means is a gasket which surrounds the aperture inside the enclosure, and the mechanically-compliant thermally activated means is a bimetal actuator which moves a plug into said gasket when heated.

7. A storage apparatus as defined in claim 4, wherein the mechanically-compliant thermally activated means is a bistable bimetal actuator.

* * * * *